(12) United States Patent
Yamamoto

(10) Patent No.: US 8,080,324 B2
(45) Date of Patent: Dec. 20, 2011

(54) HARD COATING EXCELLENT IN SLIDING PROPERTY AND METHOD FOR FORMING SAME

(75) Inventor: Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 259 days.

(21) Appl. No.: 12/250,226

(22) Filed: Oct. 13, 2008

(65) Prior Publication Data

US 2009/0142509 A1    Jun. 4, 2009

(30) Foreign Application Priority Data

Dec. 3, 2007  (JP) .................... 2007-311993
Aug. 13, 2008 (JP) .................... 2008-208710

(51) Int. Cl.
  *B32B 9/00* (2006.01)
(52) U.S. Cl. ............... 428/698; 204/192.1; 204/192.12; 204/192.15; 204/192.38; 428/704
(58) Field of Classification Search .............. 428/697, 428/698, 699, 704; 204/192.1, 192.12, 192.15, 204/192.38
  See application file for complete search history.

(56) References Cited

U.S. PATENT DOCUMENTS

| | | | |
|---|---|---|---|
| 4,525,417 A | 6/1985 | Dimigen et al. | |
| 4,619,865 A * | 10/1986 | Keem et al. | 428/699 |
| 5,277,987 A * | 1/1994 | Garg et al. | 428/699 |
| 5,707,748 A * | 1/1998 | Bergmann | 428/699 |
| 5,718,541 A * | 2/1998 | Bryant | 407/118 |
| 5,843,571 A | 12/1998 | Sho | |
| 6,800,383 B1 * | 10/2004 | Lakhotkin et al. | 428/698 |
| 6,887,562 B2 * | 5/2005 | Hugosson | 428/697 |
| 7,264,883 B2 * | 9/2007 | Yamamoto et al. | 428/698 |
| 7,521,131 B2 * | 4/2009 | Yamamoto | 428/697 |
| 2003/0059632 A1 | 3/2003 | Inoue | |
| 2007/0099028 A1 | 5/2007 | Yamamoto et al. | |
| 2007/0172694 A1 | 7/2007 | Yamamoto | |
| 2007/0184306 A1 | 8/2007 | Yamamoto et al. | |
| 2008/0075976 A1 | 3/2008 | Yamamoto et al. | |

FOREIGN PATENT DOCUMENTS

| | | | |
|---|---|---|---|
| DE | 32 46361 A1 | | 9/1983 |
| DE | 10 2007 003 272 A1 | | 8/2007 |
| JP | 411646 | * | 2/1991 |
| JP | 7-173608 | | 7/1995 |

(Continued)

OTHER PUBLICATIONS

U.S. Appl. No. 12/168,500, filed Jul. 7, 2008, Kenji Yamamoto.

(Continued)

*Primary Examiner* — Archene Turner
(74) *Attorney, Agent, or Firm* — Oblon, Spivak, McClelland, Maier & Neustadt, L.L.P.

(57) ABSTRACT

Disclosed is a hard coating excellent in wear resistance, insusceptible to seizure, and excellent sliding property even after use over the long term, and a method capable of forming the hard coating excellent in sliding property in a short time. The hard coating is a hard coating expressed by chemical formula $M_xB_aC_bN_c$, wherein M is at least one kind of metallic element selected from the group consisting of elements in the groups 4A, 5A, and 6A of the periodic table, and Si, Al, the hard coating having chemical composition satisfying respective formulas expressed by $0 \leq a \leq 0.2$, $0 \leq c \leq 0.2$, $0 < x-a-c$, $x-a-c < b \leq 0.9$, $0.05 \leq x < 0.5$, and $x+a+b+c=1$, where x, a, b, and c denote respective atomic ratios of M, B, C, and N.

15 Claims, 4 Drawing Sheets

FOREIGN PATENT DOCUMENTS

| | | |
|---|---|---|
| JP | 7-180030 | 7/1995 |
| JP | 2000-1768 | 1/2000 |
| JP | 2000-144376 | 5/2000 |
| JP | 2001-269801 * | 10/2001 |
| JP | 2002-307128 | 10/2002 |
| JP | 2002-307129 | 10/2002 |
| JP | 2006-009059 * | 1/2006 |
| JP | 2006-124818 | 5/2006 |

OTHER PUBLICATIONS

Office Action issued Mar. 10, 2011, in German Patent Application No. 10 2008 056 189.4 (with English-language translation).

* cited by examiner

HARD COATING EXCELLENT IN SLIDING PROPERTY AND METHOD FOR FORMING SAME

BACKGROUND OF THE INVENTION

1. Field of the Invention

The invention relates to a hard coating excellent in sliding property, formed on respective surfaces of, for example, a die for metal forming, a jig for metal working, and to a method for forming the hard coating.

2. Description of the Related Art

In connection with the die for metal forming, and the jig for metal working, there have since been advanced in improvement of wear resistance and anti-seizing property, effected by nitriding. Improvement of wear resistance and anti-seizing property, to be effected by a vapor phase coating process such as PVD, in place of the nitriding, has lately been under study.

For example, in Patent Document 1, there has been described a technology for improving sliding property by forming a coating composed of a composite nitride containing at least two varieties of metal nitrides among nitrides of Cr, Ti, Al, and V. Further, in Patent Document 2, and Patent Document 3, there has been described a technology for improving sliding property by forming a primary coat comprised of at least one variety of nitride, carbide, and nitriding carbide, containing one variety or more of metallic elements selected from the group consisting of Ti, V, Cr, Al, and Si, as a primary constituent, and forming an uppermost coat comprised primarily of Ti, V, Cr, Al, Si, and Cu or an uppermost coat comprised of a sulfide containing one kind or more of elements among Ti and Cr, and Mo as the balance, on the surface of the primary coat. Still further, in Patent Document 4, there has been described a technology for improving wear resistance and anti-seizing property by forming a surface coat composed of a compound containing molybdenum disulfide, or molybdenum disulfide, as a primary constituent, on the surface of the primary coat of a high-hardness coating comprised of TiN, TiCN, CrN, and so forth.

Furthermore, Patent Document 5 represents the invention for which the present applicant has already submitted the application for patent. In Patent Document 5, there has been disclosed a technology for improving wear resistance and anti-seizing property by forming a coating of composition expressed by $(X_c M_{1-c}) (B_a C_b N_{1-a-b})$ (where M denotes at least one kind of element among W and V, X indicates at least one kind of element selected from elements of the groups 4A, 5A, and 6A of the periodic table, and the group consisting of elements Al, Si, Fe, Co, and Ni while c, 1-c, a, b, 1-a-b denote atomic ratios of X, M, B, C, and N, respectively).

The coating composed of the composite nitride containing the at least two varieties of the metal nitrides selected among the nitrides of Cr, Ti, Al, and V, as described in Patent Document 1, is a coating high in hardness, and excellent in wear resistance, but the coating is unsatisfactory in anti-seizing property, and is therefore unable to withstand application in harsh environments such as plastic working under a high contact pressure. Further, the coating comprising the primary coat composed of the at least one variety of nitride, carbide, and nitriding carbide, containing one variety or more of the metallic elements selected from the group consisting of Ti, V, Cr, Al, Si, as the primary constituent, and the uppermost coat comprised primarily of Ti, V, Cr, Al, Si, and Cu, formed on the surface of the primary coat, as described in Patent Document 2, is also high in hardness, and excellent in wear resistance as is the case with the coating described in Patent Document 1, but the coating is inferior in anti-seizing property. Still further, the coating described in Patent Documents 3, and 4, respectively, is provided with the uppermost coat composed of the sulfide formed for the purpose of improvement in anti-seizing property. Since the sulfide is relatively soft, this coating is certainly excellent in sliding property at the outset of application, however, the coating undergoes wear over time with the elapse of application time, having therefore a problem in respect of long-term durability.

---

[Patent Document 1] JP—A No. 2000—144376
[Patent Document 2] JP—A No. 2002—307129
[Patent Document 3] JP—A No. 2002—307128
[Patent Document 4] JP—A No. 2000—1768
[Patent Document 5] JP—A No. 2006—124818

---

SUMMARY OF THE INVENTION

The invention has been developed in an attempt to solve problems encountered in the past, and it is therefore an object of the invention to provide a hard coating excellent in sliding property, insusceptible to seizure, and capable of maintaining excellent sliding property even after application over the long term. Another object of the invention is to provide a method capable of forming the hard coating excellent in sliding property in a short time.

In accordance with one aspect of the invention, there is provided a hard coating excellent in sliding property, as a hard coating expressed by a chemical formula $M_x B_a C_b N_c$, wherein M is at least one kind of metallic element selected from the group consisting of elements in the groups 4A, 5A, and 6A of the periodic table, and Si, Al, the hard coating having chemical composition satisfying respective formulas expressed by $0 \leq a \leq 0.2$, $0 \leq c \leq 0.2$, $0 < x-a-c$, $x-a-c < b \leq 0.9$, $0.05 \leq x < 0.5$, and $x+a+b+c=1$, where x, a, b, and c denote respective atomic ratios of M, B, C, and N.

Both the atomic ratio a, and the atomic ratio c may be 0, satisfying a formula expressed by $0.1 \leq x \leq 0.4$.

M as above may be W, satisfying respective formulas expressed by $0 \leq a \leq 0.12$, $0.5 < b \leq 0.8$, $0.01 \leq c < 0.15$, and $0.2 \leq x < 0.5$.

The hard coating preferably has a crystal structure including a mixture of δ-WN and WC 1-x.

The invention provides in its another aspect a method for forming the hard coating on the surface of a substrate, said method comprising the steps of preparing a metal target composed of a metallic element M, or a complex target composed of the metallic element M, and B, making use of the metal target, or the complex target, in an atmosphere of a mixture of Ar and a hydrocarbon gas, or mixture of Ar, the hydrocarbon gas, and nitrogen gas, within a cathode arc ion plating system, and forming magnetic field lines substantially orthogonal to an evaporation face of the target, and diverging forward, or traveling in parallel with each other, thereby forming the hard coating on the surface of the substrate.

The metallic element M may be Ti, or V, the hydrocarbon gas may be methane ($CH_4$) gas, and a relationship between a methane partial pressure (Pa), and an arc current density (A/cm$^2$) preferably satisfies a formula expressed by methane partial pressure (Pa)>0.163+1.44x arc current density (A/cm$^2$).

Further, the method may comprise the steps of preparing a target composed of WC, making use of the target in an atmosphere of a mixture containing a carbon-containing gas and nitrogen within a cathode arc ion plating system, and forming magnetic field lines substantially orthogonal to an evaporation face of the target, and diverging forward, or traveling in parallel with each other, thereby forming the hard coating on the surface of the substrate.

With the hard coating according to the one aspect of the invention, excellent in sliding property, wear resistance is exhibited as a result of formation of a carbide of the metallic element M, and further, excellent slidable property such as low μ can be obtained by generation of free carbon constituent not reacting with the metallic element M. That is, it is possible to obtain the hard coating excellent in wear resistance, insusceptible to seizure, and excellent sliding property even after use over the long term.

With the hard coating according to a variant on the one aspect of the invention, C content in the coating can be relatively increased, thereby effectively lowering coefficient of friction in a low temperature region below 400° C., in particular, and attaining reduction in wear amount.

With the hard coating according to another variant on the one aspect of the invention, it is possible to obtain the hard coating excellent in lubricity, high in hardness, excellent in wear resistance, insusceptible to seizure, and excellent sliding property even after use over the long term.

With the hard coating according to still another variant on the one aspect of the invention, WC 1-x excellent in sliding property, and δ-WN excellent in wear resistance can be generated in the hard coating, so that it is possible to obtain the hard coating excellent in balance between the sliding property, and the wear resistance.

With the method for forming the hard coating according to the another aspect of the invention, by feeding a hydrocarbon gas, and other gases in a state as applied with a magnetic field for forming magnetic field lines substantially orthogonal to an evaporation face of a target, and diverging forward, or traveling in parallel with each other, it is possible to ionize those gasses to be captured in the coating to thereby increase C content, so that the hard coating excellent in sliding property can be formed in a short time.

With the method for forming the hard coating according to a variant on the another aspect of the invention, it is possible to render C content of the coating not less than a suitable atomic ratio such that free C constituent not in reaction with Ti can be generated without fail.

With the method for forming the hard coating according to another variant on the another aspect of the invention, film formation is carried out by making use of a target composed of WC in an atmosphere of a mixture containing a carbon-containing gas and nitrogen within an arc ion plating system, thereby enabling the hard coating excellent in sliding property to be highly stably formed in a short time.

BRIEF DESCRIPTION OF THE DRAWINGS

Embodiment(s) of the present invention will be described in detail based on the following figures, wherein.

DESCRIPTION OF THE PREFERRED EMBODIMENTS

Figure 1:
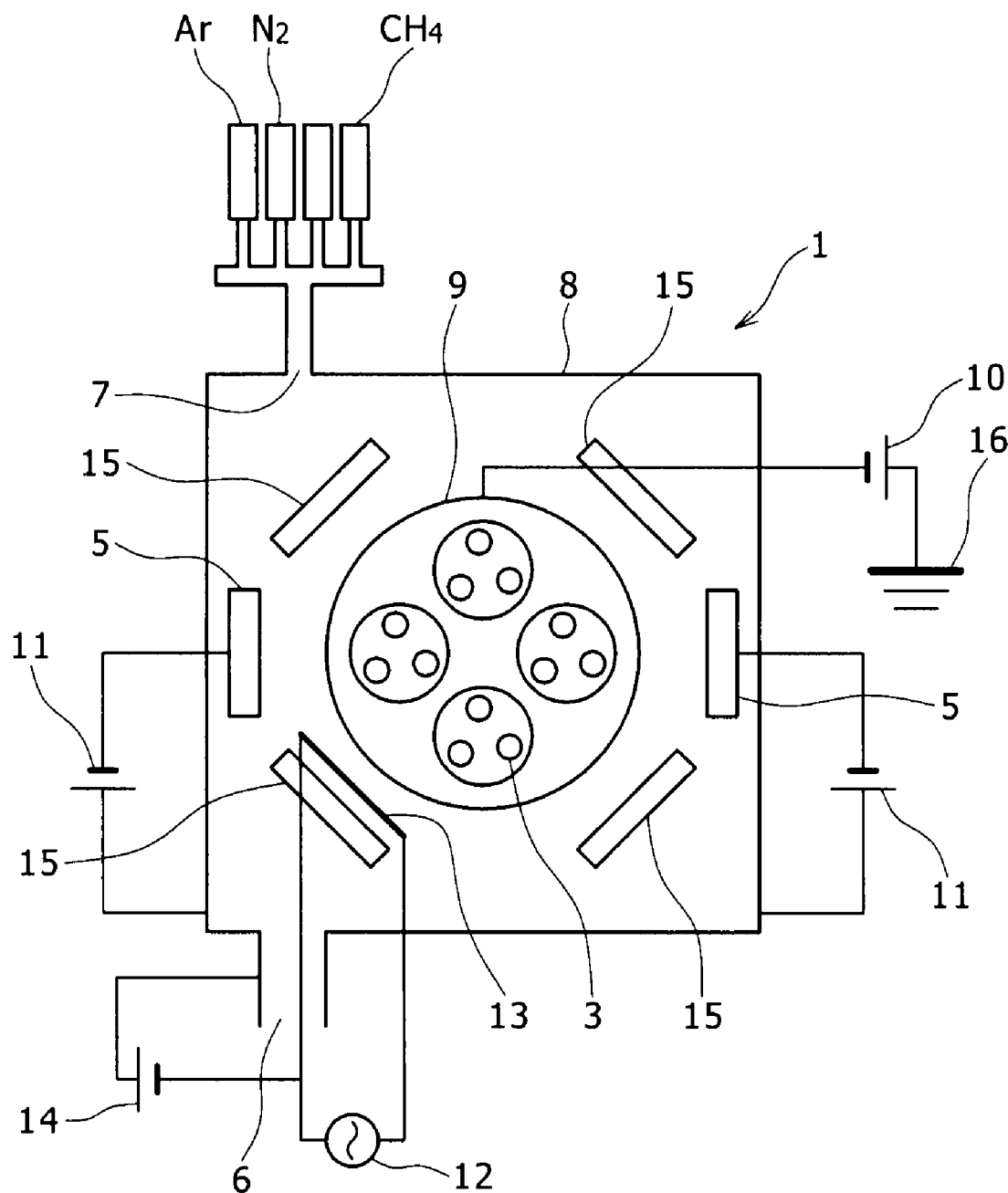
FIG. 1 is a schematic sectional view showing an example of a cathode arc ion plating system, for use in formation of a hard coating according to the invention.

The invention will be described in more detail hereinafter with reference to embodiments thereof.

A hard coating according to the invention refers to a hard coating that can be expressed by chemical formula $M_xB_aC_bN_c$, wherein M is at least one kind of metallic element selected from the group consisting of elements in the groups 4A, 5A, and 6A of the periodic table, and Si, Al, the hard coating having composition satisfying respective formulas expressed by $0 \leq a \leq 0.2$, $0 \leq c \leq 0.2$, $0 < x-a-c$, $x-a-c < b \leq 0.9$, $0.05 \leq x < 0.5$, and $x+a+b+c=1$. The reason why the composition of the hard coating, as to M, B, C, and N, are restricted as above is described as follows.

Numerical values x, a, b, and c denote respective atomic ratios of M, B, C, and N, and a numerical value representing the sum of all the atomic ratios is 1 (that is, amounting to 100%) ($x+a+b+c=1$).

Firstly, requirements for the hard coating according to the invention are that the hard coating has composition so as to enable the same to exhibit wear resistance by forming a carbide of a metallic element M, as described in a paragraph concerning the effect of the invention, and to acquire excellent slidable property such as low μ by generating a free carbon constituent C not reacting with the metallic element M.

When reactivities of B, C, and N, respectively, with a metallic element M are considered, reactivity of the metallic element M, with B, and N, respectively, is more intensive than reactivity thereof, with C, so that when B, C, and N are concurrently added, nitride and boride are first preferentially generated, and subsequently, carbide is generated by residual metallic element M reacting with C. Accordingly, formation of carbide composed of the metallic element M and C is conditional upon the atomic ratio of residual metallic element M not reacting with C, obtained by deducting the atomic ratios a, c of B, N, from the atomic ratio x of the metallic element M, that is, x–a–c, is greater than 0. (0<x–a–c)

Further, requirements for generation of the free carbon constituent C are that an atomic ratio of a portion of the metallic element M, not reacting with B and N, namely, x–a–c, obtained by deducting the atomic ratios a, c of B, N, respectively, from the atomic ratio x of the metallic element M, is smaller than the atomic ratio b of C. (x–a–c<b)

If the case where B and N are not added is taken into consideration, the atomic ratio of C needs be not less than 0.5 in order to meet the requirements for x–a–c<b without fail. The atomic ratio of C is more preferably not less than 0.7. However, if the atomic ratio b of C exceeds 0.9, this will render the atomic ratio x of the metallic element M relatively lower, so that respective proportions of metal carbide, metal nitride, and metal boride, playing a role of enhancing wear resistance, will become relatively low. The atomic ratio of C therefore needs be not more than 0.9. (b≦0.9) The atomic ratio of C is more preferably not more than 0.8.

The nitride of the metallic element M, and the boride of the metallic element M are thermally stable as compared with the carbide of the metallic element M, and since addition of B and N will enable heat resistance of the coating to be improved, the addition of B and N is effective. However, if B and N each are added in excess of 0.2 in atomic ratio, this will cause the atomic ratio b of C to be relatively low, so that the respective atomic ratios a, c of B and N are set to not more than 0.2. Further, the addition of B and N is not necessarily required for increasing the atomic ratio b of C, and the respective atomic ratios a, c of B, and N may both be 0. ($0 \leqq a \leqq 0.2$, $0 \leqq c \leqq 0.2$)

Now, the addition of B and N has effects on wear resistance although an extent of such effects will vary according to a temperature region where the die, and jig, with the hard coating deposited thereon, respectively, are used. The effects in a temperature region lower than 400° C. is not so significant, however, the addition of B and N has certainly effects on improvement in wear resistance in a temperature region at 400° C. or higher. Accordingly, the addition of B and N is recommendable for the coating to be deposited on a die and a jig, for application in the temperature region at 400° C. or higher. By addition of at least either of B and N, at not less than 0.05 in atomic ratio, it is possible to profoundly improve wear resistance at a high temperature of 400° C. or higher.

The metallic element M to which B and N are added is at least one kind of the metallic element selected from the group consisting of elements in the groups 4A, 5A, and 6A of the periodic table, and Si, Al, and the same is preferably the metallic element M of which carbide, nitride, and boride, high in hardness, can be formed. It is recommendable to singly add Ti, V, Zr, Nb, Cr, and Si, or a complex element containing any of those elements as the main constituent. Because Ti, V, among those metallic elements M, are high in hardness, and a carbide thereof, low in coefficient of friction, is formed, Ti, V are particularly recommendable as elements for addition.

Further, the role of the metallic element M being to bond with C, N, and B, respectively, to thereby form a metal carbide, metal nitride, and metal boride, excellent in wear resistance, the atomic ratio x of the metallic element M need be 0.05 at the minimum, and need be preferably not less than 0.1. However, if the atomic ratio x of the metallic element M is not less than 0.5, this will render it impossible to satisfy the formula of x−a−c<b, previously described. Therefore, the atomic ratio x of the metallic element M need be less than 0.5, and preferably not more than 0.3. ($0.05 \leqq x < 0.5$)

Next, there is described hereinafter the case where both the atomic ratio a of B, and the atomic ratio c of N are 0, that is, the case where B and N are not added.

If a=c=0, this will relatively increase C content in the coating, thereby affecting the coating deposited on a die and a jig, for use in a low temperature region below 400° C., in particular, bringing about a decease in coefficient of friction, and reduction in wear amount. In the case where B and N are not added, the atomic ratio x of the metallic element M is preferably in a range of 0.1 to 0.4, and more preferably in a range of 0.2 to 0.3.

Next, there is described hereinafter a method for forming the hard coating described in the foregoing.

It is possible to obtain the hard coating of desired composition by making use of a metal target composed of the metallic element M, and a C target, and causing those targets to undergo concurrent electric discharge, however, this method for forming the hard coating has a problem in that a deposition rate is very low, and it is therefore time-consuming to form the hard coating by this method. Accordingly, the inventor, et. al have continued strenuous studies, and as a result, they have reached an idea on a method for forming a hard coating, according to the invention.

The method for forming the hard coating is a method for forming the hard coating, by use of, for example, an arc ion plating system 1 of a cathode-discharge type, shown in FIG. 1, wherein a hydrocarbon gas, and nitrogen gas, together with argon, are fed while the metallic element M is caused to undergo evaporation from a target 2, such as a metal target composed of the metallic element M, and a complex target composed of the metallic element M, and B, with the use of an arc evaporation source 5, and those gasses are ionized to be captured in a coating formed on the surface of a substrate 3, thereby enabling the hard coating excellent in sliding property to be formed in a short time.

First, the configuration of the arc ion plating system 1 of the cathode-discharge type is briefly described hereinafter by way of example with reference to FIG. 1. As shown in FIG. 1, the arc ion plating system 1 comprises a vacuum chamber 8 having an exhaust port 6 communicating with a vacuum pump (not shown), thereby carrying out vacuum pumping, and a gas feed inlet 7 for feeding film-forming gases such as argon, a hydrocarbon gas nitrogen gas, the arc ion plating system 1 further comprising the arc evaporation sources 5 for causing the target 2 (shown in FIG. 2) serving as a cathode, to undergo evaporation due to arc discharge, before ionization, a substrate stage 9 for supporting the substrate 3 on which the hard coating is formed, and a bias power supply 10 for applying a minus voltage to the substrate 3 through the substrate stage 9, between the substrate stage 9, and the vacuum chamber 8. Further, the bias power supply 10 is provided with earth ground 16.

Reference numeral 12 shown in FIG. 1 denotes an AC power supply for filament heating, for applying a voltage to a filament type ion source 13, reference numeral 14 denotes a DC power supply for discharge, and reference numeral 15 denotes respective heaters provided at four locations so as to surround the substrate stage 9.

Figure 2:
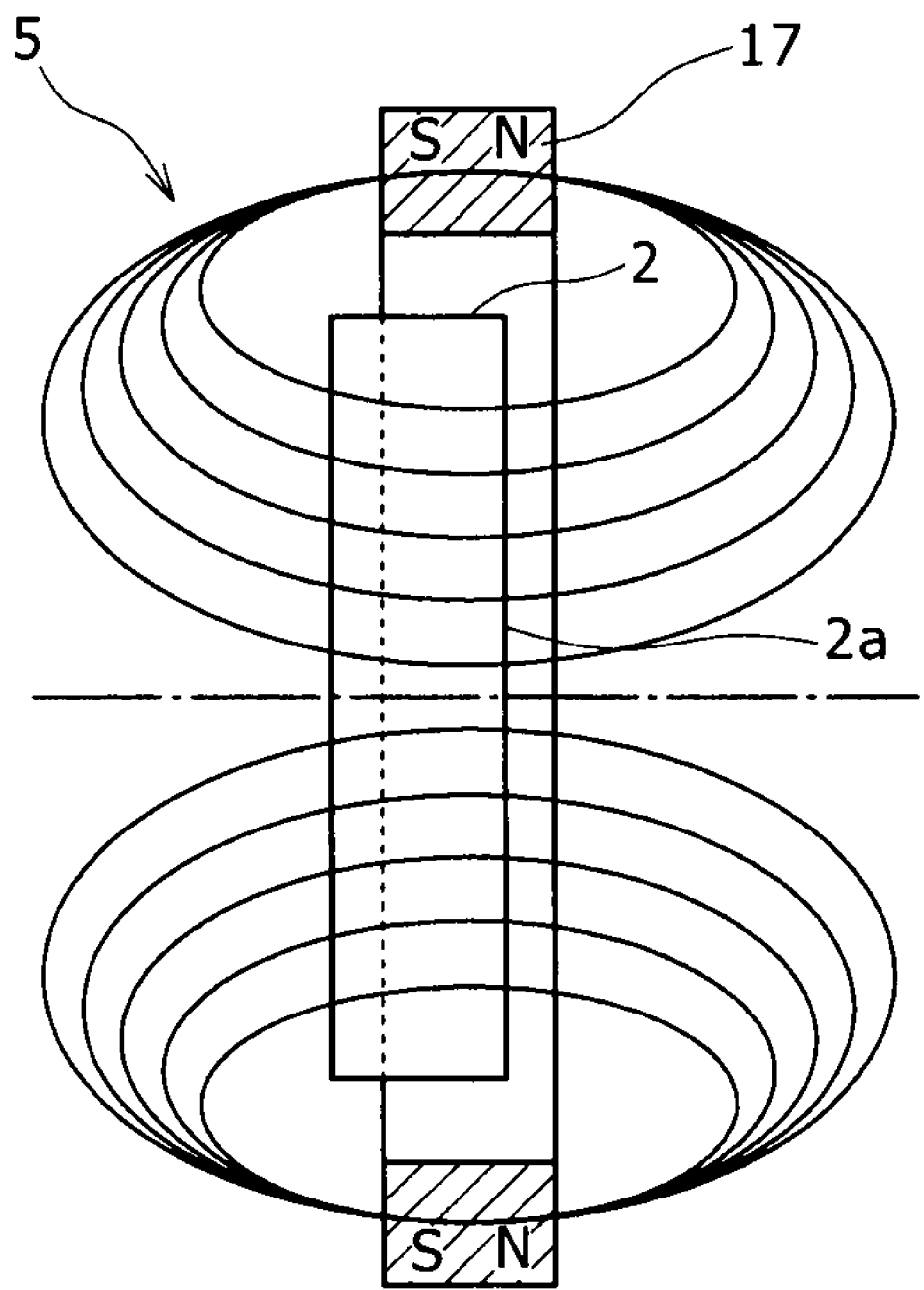
FIG. 2 is a schematic sectional view showing an example of an application evaporation source of the arc ion plating system.

As shown in FIG. 2, the arc evaporation source 5 is provided with the target 2 serving as the cathode, an arc power supply 11 connected between the target 2, and the vacuum chamber 8 serving as an anode, and magnets (permanent magnets) 17 for forming magnetic field lines 4 that are substantially orthogonal to an evaporation face 2a of the target 2, and are diverging forward, or traveling in parallel with each other.

The magnets 17 are disposed so as to surround the evaporation face 2a of the target 2. Herein, "substantially orthogonal to an evaporation face 2a of the target 2" is meant to include a scope up to an inclination by about 30 degrees or less to the direction of the normal to the evaporation face 2a. Further, the arc evaporation source 5 shown in FIG. 2 is described as an application evaporation source A in the case of an embodiment of the invention to be described later on.

Figure 3:
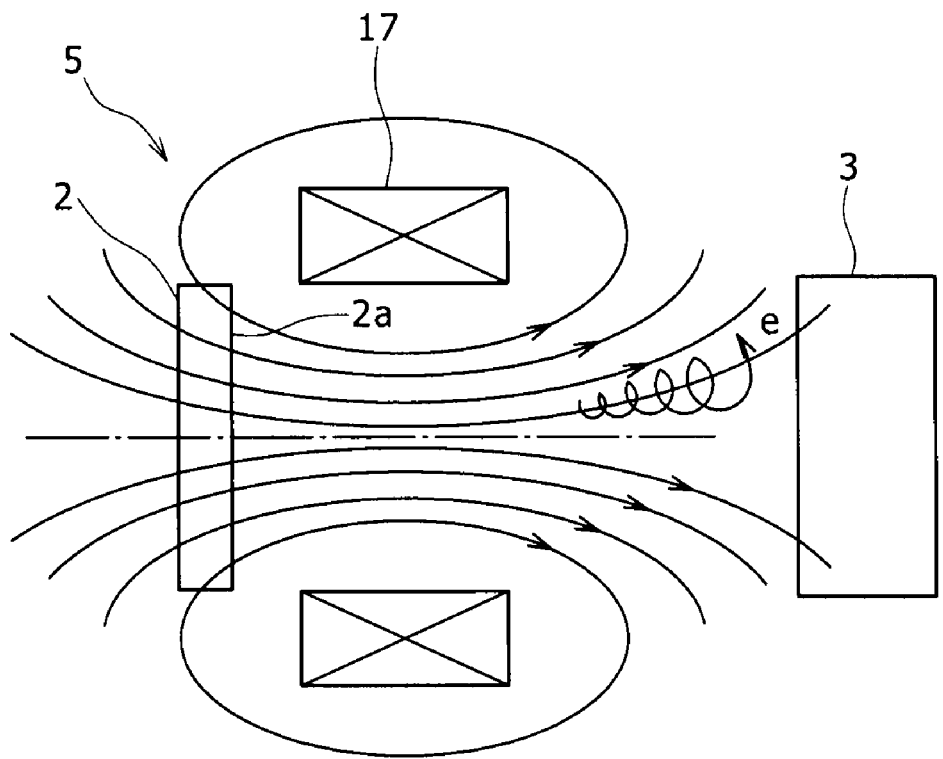
FIG. 3 is a schematic sectional view showing another example of the application evaporation source of the arc ion plating system.

In FIG. 3, there is shown an example of an arc evaporation source 5, differing from that shown in FIG. 2. With this arc evaporation source 5, electromagnets instead of the permanent magnets are used as the magnets 17. In contrast to the case of FIG. 2, respective locations where the magnets 17 are disposed are positions forward of the evaporation face 2a of the target 2, more specifically, positions where the front of the evaporation face 2a, on a side of the target 2, adjacent to the substrate 3 on which the hard coating is to be formed, are surrounded by the magnets 17. Even if the magnets 17 are disposed at those locations, respectively, it is possible to form magnetic field lines 4 that are substantially orthogonal to the evaporation face 2a of the target 2, and are diverging forward, or traveling in parallel with each other. Further, the arc evaporation source 5 shown in FIG. 3 is described as an application evaporation source B in the case of an embodiment of the invention to be described later on.

Figure 4:
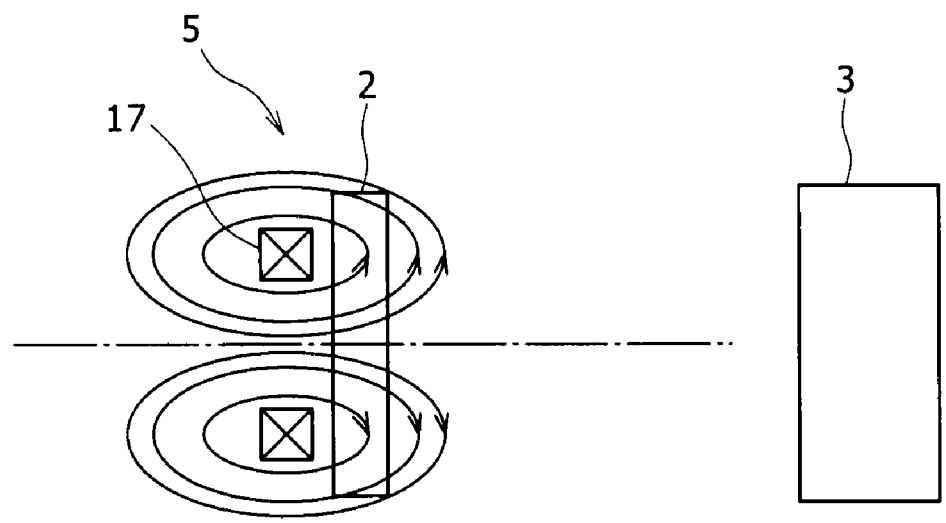
FIG. 4 is a schematic sectional view showing an application evaporation source of a conventional arc ion plating system.

An arc evaporation source 5 shown in FIG. 4 is not the arc evaporation source 5 to be used in the method for forming the hard coating, according to the invention, but is an arc evaporation source 5 for use in a conventional arc ion plating system 1, which is therefore described hereinafter for reference. With this arc evaporation source 5, magnets (electromagnets) 17 are disposed on the backside of a target 2 (on a side thereof, opposite from a substrate 3), and magnetic field lines 4 as formed become substantially parallel with an evaporation face 2a of the target 2, in the vicinity of the evaporation face 2a thereof, without reaching as far as the vicinity of the substrate 3. Further, the arc evaporation source 5 shown in FIG. 4 is described as an application evaporation source C in the case of an example to be described later on.

With the hard coating according to the invention, since the atomic ratio of C is high as compared with the atomic ratio of the metallic element M, it is necessary to efficiently decompose the hydrocarbon gas among the film-forming gases fed from the gas feed inlet 7 into the vacuum chamber 8 when forming the hard coating to thereby obtain C constituent, and for that purpose, the magnetic field lines are preferably formed in a state substantially orthogonal to the evaporation face 2a of the target 2, and diverging forward, or traveling in parallel with each other. In the case of using the arc ion plating system 1 of the cathode-discharge type, electrons e are discharged from the cathode, and the electrons e subjected to arc discharge are caused to fly toward the anode, whereupon, if there are present the magnetic field lines 4 substantially orthogonal to the evaporation face 2a of the target 2, and diverging forward, or traveling in parallel with each other, the electrons e subjected to the arc discharge will travel while in helical motion in such a way as to wind round each of the magnetic field lines 4, as shown in, for example, in FIG. 3. Thus, if a magnetic field is applied, a trajectory of each of the electrons e becomes longer, and the electrons e each repeat numerous collisions with the gases as fed, thereby promoting ionization, and decomposition of the hydrocarbon gas.

Further, the reason why Ar, together with the hydrocarbon gas, and the nitrogen gas, is fed from the gas feed inlet 7 into the vacuum chamber 8, is because ionized argon is caused to collide with a coating in the process of formation to thereby cause the coating to be more closely-gained, and higher in hardness. A proportion of Ar is preferably in a range of 30 to 70 vol. % against all the gases as fed, and more preferably in a range of 40 to 60 vol. %. Further, pressure inside the vacuum chamber 8 at the time of film formation is preferably in a range of about 0.5 to 5 Pa. If the pressure is lower than 0.5 Pa, electric discharge will become unstable, and if the pressure is higher than 5 Pa, the deposition rate will become lower due to scattering of the gasses. Still further, the pressure inside the vacuum chamber 8 at the time of film formation is more preferably in a range of 1 to 3 Pa. The hydrocarbon gas to be fed can include, for example, methane gas, ethylene gas, acetylene gas, toluene gas, and benzene gas.

Further, upon the formation of the hard coating according to the invention, the atomic ratio of the metallic element M need be adjusted so as not to exceed the atomic ratio of C, which can be coped with by controlling an arc discharge current low. That is, the atomic ratio of C in the hard coating varies according to an arc current density.

Assuming that the metallic element M in use for the target 2 is, for example, Ti, and the hydrocarbon gas to be fed is methane ($CH_4$) gas, a relationship between a methane partial pressure (Pa), and an arc current density ($A/cm^2$) can be expressed by the following formula:

$$\text{methane partial pressure (Pa)} > 0.163 + 1.44 \times \text{arc current density (A/cm}^2\text{)}$$

The above will be described in detail with reference to the embodiment to be described later on.

By satisfying the formula as above, the atomic ratio of C in the hard coating can be rendered not less than 0.7, which is more preferable atomic ratio of C when B and N are not added. Further, the formula described as above can be applied to a target 2 composed of V, and so forth, having an evaporation amount equivalent to that of Ti at an identical arc current.

In addition, it is also recommendable to use W as the metallic element M for addition. If W is adopted as the metallic element M for addition, this will enable W—C bond excellent in lubricity, in particular, and W—N bond high in hardness to be formed. Accordingly, in the case of W being adopted as the metallic element M for addition, C and N become essential elements.

The atomic ratio b of C contained in the hard coating need be in excess of at least 0.5, and the coating with the atomic ratio b of C at less than 0.8 will be excellent in lubricity, and low coefficient of friction. ($0.5 < b \leq 0.8$) The atomic ratio b of C is more preferably not less than 0.55.

Because even with addition of N in a trace quantity, W—N bond excellent in wear resistance can be formed, the lower limit of the atomic ratio c of N contained in the hard coating is set to 0.01, and more preferably to 0.02. On the other hand, excessive addition of N will cause deterioration in lubricity, thereby resulting in a rise in coefficient of friction, and wear resistance as well undergoes deterioration. Accordingly, the upper limit of the atomic ratio c of N contained in the hard coating is set to less than 0.15. ($0.01 \leq c < 0.15$) The upper limit of the atomic ratio c of N is more preferably 0.1.

B is a selectable element, but can be added because if B is added, this will generate W—B bond high in hardness and B—N bond having lubricity as well. However, since excessive addition of B will turn the coating in whole into an amorphous state to thereby deteriorate hardness thereof, the upper limit of the atomic ratio a of B contained in the hard coating is set to 0.12. ($0 \leq a \leq 0.12$) The upper limit of the atomic ratio a of B is more preferably 0.05. If temperature at the time of sliding motion is not so high, and close to room temperature, a=0 is recommendable.

The atomic ratio x of W contained in the hard coating is dependent on the respective atomic ratios of C, B, and N, described in the foregoing, however, if the atomic ratio x of W is less than 0.2, bonds of W—C, W—N, W—B, and so forth, respectively, will be less, resulting in deterioration in wear resistance. On the other hand, if the atomic ratio x of W is not less than 0.5, lubricity is lost, thereby deteriorating wear resistance. Accordingly, the atomic ratio x of W contained in the hard coating is in a range of 0.2 to 0.5. ($0.2 \leq x < 0.5$) The upper limit of the atomic ratio x of W is more preferably 0.45.

The crystal structure of the coating varies according to composition (the respective atomic ratios) concerning those elements described. The crystal structure of the coating without N added thereto is a cubic crystal of WC 1-x, excellent in sliding property, however, with addition of N in a trace quantity, a hexagonal crystal of δ-WN, as a nitride excellent in wear resistance, is formed in the coating.

When the coating have the crystals of both WC 1-x, and δ-WN, both the wear resistance and the coefficient of friction thereof will be excellent, and a balance between the sliding property, and the wear resistance will be excellent, so that a mixture film having the crystals of both WC 1-x, and δ-WN is recommendable as a superior coating. Further, the crystal structure of the coating is identified by x-ray diffraction.

Next, there is described hereinafter a method for forming the hard coating wherein the metallic element M for addition is W.

The hard coating containing W can be formed by an arc ion plating method using the arc ion plating system 1, besides a sputtering method, however, the sputtering method using a W target has a problem in terms of practicality because a deposition rate is very low. Further, if the W target is used in the arc ion plating method, arc discharge of W is unstable, and therefore, even the arc ion plating method has a problem in terms of practicality.

Accordingly, the inventor, et. al have continued strenuous studies, and as a result, they have reached an idea on the following method for forming the hard coating. In the invention, it has been elucidated that the hard coating containing W can be formed at a high speed and highly stably by use of the arc ion plating method using a target composed of WC as the target at the time of forming the hard coating containing W.

The arc ion plating method is a method for forming the hard coating with the use of the arc ion plating system, as previously described. To briefly describe the same, it is a method for forming the hard coating on the surface of the substrate 3 with the use of the arc ion plating system 1 of the cathode-discharge type, shown in FIG. 1, wherein the magnetic field lines 4 are in the state substantially orthogonal to the evaporation face 2a of the target 2, and diverging forward, or traveling in parallel with each other.

Further, it has been described that the hard coating containing W can be formed at a high speed and highly stably by use of the arc ion plating method using the target composed of WC as the target, however, since C is prone to be lost from the hard coating as formed if the target composed of WC is simply used, it is necessary to execute film formation in an atmosphere of a mixture containing C-containing gases such as methane ($CH_4$) gas, and acetylene ($C_2H_2$) gas, and nitrogen in order to make up for C.

Further, besides the C-containing gases, and nitrogen, a rare gas such as Ar, Ne, and Xe may be added for the purpose of stability in electric discharge.

If a partial pressure of the C-containing gas at the time of film formation is excessively high, this will cause deposition of C on the surface of the WC target, resulting in difficulty with electric discharge, so that the partial pressure is preferably set to not higher than 0.5 Pa, and more preferably to not higher than 0.2 Pa.

Further, a crystal structure of the coating undergoes a change by the agency of a bias voltage applied to the substrate at the time of film formation, and if the bias voltage is excessively low, a δ-WN phase ratio will be lower, so that the coating is unable to exhibit wear resistance. On the other hand, if the bias voltage is excessively high, energy incident on the substrate becomes excessively high, thereby inviting a rise in temperature of the substrate, and causing a WC 1-x ratio to be lower. Accordingly, the bias voltage is preferably set to a range of −50 V to −100 V.

Further, in the case of executing film formation with the use of not only the WC target but also a metal oxide target composed of MC, there is a tendency that the atomic ratio b of C contained in the coating to be formed is less than an atomic ratio of C contained in the target, so that it is difficult to form the coating meeting the condition of x–a–c<b. Accordingly, at the time of film formation, the film formation need be executed with the use of the C-containing gases without fail.

EMBODIMENTS OF THE INVENTION

Embodiment 1

Coatings of respective compositions with respective atomic ratios of constituents shown in Table 1 were formed on the surface of a substrate in the arc ion plating system 1 of the cathode-discharge type, shown in FIG. 1, using the metal target composed of the metallic element M, or the complex target composed of the metallic element M, and B. With Embodiment 1, in order to check the composition of each of the coatings, and to measure hardness of the coatings at first, a cemented carbide with a surface thereof, subjected to mirror polishing, was used for the substrate, and the coatings of the respective compositions shown in Table 1 were formed on the surface of the cemented carbide. In addition, SKD 11 substrate (hardness: HRC 60) was adopted as a substrate for use in a sliding property test, and a CrN layer 3 μm thick was formed on the surface of the substrate in order to enhance adhesiveness, subsequently forming the coatings of the respective compositions shown in Table 1 on the surface of the CrN layer.

After placing each of those substrates on the substrate stage of the arc ion plating system at first, air was discharged from the exhaust port by the vacuum pump to thereby bring down pressure inside the vacuum chamber to not higher than $1 \times 10^{-3}$ Pa, and the substrate was heated to 400° C., subsequently applying sputtering by use of Ar ions. Subsequently, a target of φ100 mm, containing the metallic element M, was put to use (when forming a coating containing B, a complex target composed of the metallic element M, and B is put to use instead of a metal target composed of the metallic element M only as B will cause evaporation of a target to be captured in the coating), and Ar and methane ($CH_4$) gas were fed into the vacuum chamber (additionally feeding nitrogen in the respective cases of test pieces Nos. 8, 9, 19 to 23, in Table 1) under conditions of a methane ($CH_4$) gas partial pressure at 1.5 Pa, and a total pressure at 3 Pa in an atmosphere of a mixture gas of Ar—$CH_4$ (—$N_2$), at an arc current at 60 A, thereby having executed film formation of a coating. In this case, an arc evaporation source in use, that is, an application evaporation source was the application evaporation source A shown in FIG. 2, or the application evaporation source C shown in FIG. 4. A voltage applied to the substrate at the time of film formation was at 200 V.

Respective compositions of the coatings were checked by analysis with the use of an electron beam micro-analyzer (EPDA), and hardness of each of the coatings was measured with the use of a micro-Vickers hardness tester (test load: 0.25 N). A coating having hardness at 30 GPa, or higher is determined as the coating high in hardness, and excellent in wear resistance. Further, in the sliding property test, respective coatings were examined in respect of coefficient of friction, and a wear depth under conditions at 25° C. when no heating is applied (room temperature), and at 400° C., respectively. The coefficient of friction, small in value, indicates insusceptibility to seizure, and the wear depth, small in value, indicates excellent wear resistance. Further, as to the coefficient of friction, a mean value thereof for a slide distance in a range of 100 to 300 m where the most stable data are obtainable within a slide distance described hereunder was adopted as data. A pass/fail criterion for the coefficient of friction was not more than 0.35, and a pass/fail criterion for the wear depth was not more than 2.0 μm.

A sliding property testing apparatus used in the sliding property test, and test conditions are as shown hereunder. Further, test results are as shown in Table 1.

Testing Apparatus: Vane-on-disk type Tester
Vane: SKD 61 steel (hardness: HRC 50), 3.5×5 mm, length: 20 mm, radius up to the tip: 10 R
Disk: SKD 61 steel (hardness: HRC 60) with coating
Slide Speed: 0.2 m/sec
Load: 500 N
Slide Distance: 500 m
Test Temperature: 25° C. (no heating), and 400° C.

TABLE 1

| No. | Application evaporation source | Constituents of a coating (atomic ratio) | | | | | | hardness GPa | Coefficient of friction (25° C.) Mean value for 100-300 m | Wear depth (400° C.) Mean value for 100-300 m | Wear depth (25° C.) μm | Wear depth (400° C.) μm | Wear depth variation (H − L) μm |
|---|---|---|---|---|---|---|---|---|---|---|---|---|---|
| | | | M(x) | B(a) | C(b) | N(c) | B + N | | | | | | |
| 1 | C | Ti | 0.50 | 0.00 | 0.00 | 0.50 | 0.50 | 22 | 0.55 | 0.55 | 3.0 | 5.0 | 2.0 |
| 2 | A | Ti | 0.70 | 0.00 | 0.30 | 0.00 | 0.00 | 18 | 0.70 | 0.60 | 3.5 | 5.0 | 1.5 |
| 3 | A | Ti | 0.50 | 0.00 | 0.50 | 0.00 | 0.00 | 33 | 0.60 | 0.50 | 3.0 | 5.0 | 2.0 |
| 4 | A | Ti | 0.40 | 0.00 | 0.60 | 0.00 | 0.00 | 35 | 0.30 | 0.30 | 1.5 | 2.5 | 1.0 |
| 5 | A | Ti | 0.30 | 0.00 | 0.70 | 0.00 | 0.00 | 37 | 0.20 | 0.20 | 0.5 | 1.0 | 0.5 |
| 6 | A | Ti | 0.20 | 0.00 | 0.80 | 0.00 | 0.00 | 37 | 0.20 | 0.20 | 0.5 | 1.5 | 1.0 |
| 7 | A | Ti | 0.20 | 0.10 | 0.70 | 0.00 | 0.10 | 38 | 0.30 | 0.15 | 0.8 | 1.0 | 0.2 |
| 8 | A | Ti | 0.20 | 0.00 | 0.70 | 0.10 | 0.10 | 37 | 0.30 | 0.10 | 0.7 | 0.8 | 0.1 |
| 9 | A | Ti | 0.30 | 0.10 | 0.50 | 0.10 | 0.20 | 39 | 0.35 | 0.15 | 0.9 | 0.9 | 0.0 |
| 10 | A | Ti | 0.10 | 0.00 | 0.90 | 0.00 | 0.00 | 35 | 0.20 | 0.30 | 1.0 | 1.8 | 0.8 |
| 11 | A | Ti | 0.05 | 0.00 | 0.95 | 0.00 | 0.00 | 25 | 0.10 | 0.50 | 3.0 | 5.0 | 2.0 |
| 12 | A | V | 0.20 | 0.00 | 0.80 | 0.00 | 0.00 | 37 | 0.25 | 0.20 | 0.7 | 1.5 | 0.8 |
| 13 | A | V | 0.20 | 0.05 | 0.75 | 0.00 | 0.05 | 37 | 0.30 | 0.15 | 0.8 | 0.9 | 0.1 |
| 14 | A | V | 0.20 | 0.10 | 0.70 | 0.00 | 0.10 | 37 | 0.30 | 0.15 | 0.8 | 0.7 | −0.1 |
| 15 | A | V | 0.20 | 0.20 | 0.60 | 0.00 | 0.20 | 37 | 0.25 | 0.15 | 1.0 | 0.8 | −0.2 |
| 16 | A | V | 0.10 | 0.30 | 0.60 | 0.00 | 0.30 | 29 | 0.50 | 0.40 | 3.0 | 5.0 | 2.0 |
| 17 | A | V | 0.05 | 0.05 | 0.90 | 0.00 | 0.05 | 35 | 0.20 | 0.20 | 0.6 | 0.7 | 0.1 |
| 18 | A | V | 0.02 | 0.02 | 0.98 | 0.00 | 0.02 | 25 | 0.20 | 0.30 | 3.0 | 5.0 | 2.0 |
| 19 | A | V | 0.40 | 0.10 | 0.40 | 0.10 | 0.20 | 33 | 0.25 | 0.30 | 1.0 | 1.5 | 0.5 |
| 20 | A | Nb | 0.20 | 0.00 | 0.75 | 0.05 | 0.05 | 38 | 0.20 | 0.25 | 1.4 | 0.7 | −0.7 |
| 21 | A | Nb | 0.20 | 0.00 | 0.70 | 0.10 | 0.10 | 38 | 0.25 | 0.20 | 1.2 | 0.5 | −0.7 |
| 22 | A | Nb | 0.20 | 0.00 | 0.60 | 0.20 | 0.20 | 37 | 0.30 | 0.20 | 1.5 | 0.6 | −0.9 |
| 23 | A | Nb | 0.10 | 0.00 | 0.60 | 0.30 | 0.30 | 27 | 0.60 | 0.50 | 3.0 | 5.0 | 2.0 |
| 24 | A | Zr | 0.20 | 0.00 | 0.80 | 0.00 | 0.00 | 37 | 0.20 | 0.20 | 0.8 | 2.0 | 1.2 |
| 25 | A | Hf | 0.20 | 0.00 | 0.80 | 0.00 | 0.00 | 37 | 0.20 | 0.20 | 1.0 | 1.3 | 0.3 |
| 26 | A | Mo | 0.20 | 0.00 | 0.80 | 0.00 | 0.00 | 36 | 0.20 | 0.20 | 0.6 | 2.0 | 1.4 |
| 27 | A | Cr | 0.20 | 0.00 | 0.80 | 0.00 | 0.00 | 35 | 0.20 | 0.20 | 1.1 | 1.7 | 0.6 |
| 28 | A | Si | 0.20 | 0.00 | 0.80 | 0.00 | 0.00 | 38 | 0.20 | 0.20 | 1.3 | 2.0 | 0.7 |
| 29 | A | Al | 0.20 | 0.00 | 0.80 | 0.00 | 0.00 | 32 | 0.30 | 0.30 | 0.8 | 2.0 | 1.2 |

The composition of each of the coatings formed (respective atomic ratios of the constituents) is as shown in Table 1. Test pieces Nos. 4 to 10, 12 to 15, 17, 19 to 22, 24 to 29, shown in Table 1, each are a coating of composition meeting conditions according to claims 1 and 2, all the coatings having high hardness not lower than 30 GPa. Further, all the coatings are as small as not more than 0.35 in respect of coefficient of friction under the conditions at 25° C. (room temperature), and at 400° C., respectively, and are also as small as not more than 2.0 μm in respect of wear depth under the conditions at 25° C. (room temperature), and at 400° C., respectively. That is, it is evident from the above that the coating of the composition meeting the conditions according to claims 1 and 2, respectively, was excellent in wear resistance, insusceptible to seizure, and excellent sliding property after use over the long term.

Test pieces Nos. 4 to 6, 10, 12, and 24 to 29, shown in Table 1, each are the coating of composition further meeting the conditions according to claim 2. Those coatings were found conspicuous in decrease of coefficient of friction, and in reduction of wear amount under the condition of 25° C. (room temperature) in a low temperature region as compared with the coating, the metallic element M thereof, meeting the conditions according to claim 1, under the same condition, but does not meet the conditions according to claim 2.

Test piece No. 1 is a comparative example of a coating composed of TiN, in which C was not contained. In the case of the comparative example, since C was not contained therein, no carbide was formed, hardness of the coating was low, and both coefficient of friction, and a wear depth of the coating were found large under the conditions at 25° C. (room temperature), and at 400° C., respectively. As a result, the test piece No. 1 has a problem with wear resistance, and a problem with sliding property as well.

Test pieces Nos. 2, 3 each are a coating that did not meet the condition of x−a−c<b, and the condition of 0.05≦x<0.5. In the case of the coating of such a composition as described, it is not possible to generate free C constituent, and as is the case with test piece No. 1 in which C was not contained, hardness of the coating was low, and both coefficient of friction, and a wear depth of the coating were large under the conditions at 25° C. (room temperature), and at 400° C., respectively. That is, excellent slidable property, such as low μ, cannot be acquired, so that the coating had a problem with both wear resistance, and sliding property.

Test pieces Nos. 11, 18 each are a coating that did not meet the condition of b≦0.9. As the atomic ratio of C became excessively high, so did the atomic ratio of the metallic element M relatively low, so that metal carbide, metal nitride, and metal boride, playing a role of enhancing wear resistance, became relatively low in ratio. As a result, hardness of the coating became lower, and both coefficient of friction, and a wear depth of the coating were increased. That is, the coating had a problem with both wear resistance, and sliding property.

Test piece No. 16 is a coating that did not meet the condition of 0≦a≦0.2. Because B at an atomic ratio in excess of 0.2 was added, the atomic ratio of C became relatively low, so that hardness of the coating became lower, and both coefficient of friction, and a wear depth of the coating were increased under the conditions at 25° C. (room temperature), and at 400° C., respectively. That is, the coating had a problem with both wear resistance, and sliding property.

Test piece No. 23 is a coating that did not meet the condition of 0≦c≦0.2. Because N at an atomic ratio in excess of 0.2 was added, the atomic ratio of C became relatively low, so that hardness of the coating became lower, and both coefficient of friction, and a wear depth of the coating were increased under the conditions at 25° C. (room temperature), and at 400° C., respectively. That is, the coating had a problem with both wear resistance, and sliding property.

In Table 1, a difference between the wear depth under the condition at 25° C. (room temperature), and the wear depth under the condition at 400° C. is given under the notation of wear depth variation (High-Low). The coating containing B and N had a wear depth variation smaller as compared with the coating not containing B and N provided that the metallic element M for addition and the atomic ratio thereof are under the same condition, and it is therefore evident that wear resistance under a high temperature condition was enhanced by addition of B, and N.

Embodiment 2

There was adopted the arc ion plating system 1 of the cathode-discharge type, shown in FIG. 1, as is the case with Embodiment 1, wherein Ti was used for the metallic element M to serve as a metal target, an arc current and a methane ($CH_4$) partial pressure were variously changed as shown in Table 2, use was made of a cemented carbide with a surface thereof, subjected to mirror polishing, as a substrate, and hard coatings were formed on the surface of the substrate. Further, arc evaporation sources in use, that is, the application evaporation sources included three types such as the application evaporation source A shown in FIG. 2, the application evaporation source B shown in FIG. 3, and the application evaporation source C shown in FIG. 4. A voltage applied to the substrate at the time of film formation was 200 V.

With Embodiment 2, gases fed into the vacuum chamber were Ar, and methane ($CH_4$) gas only, and test conditions other than that were based on the test conditions for Embodiment 1. Respective compositions of coatings were checked by analysis with the use of the electron beam micro-analyzer (EPDA), and results of checking by analysis are shown in Table 2.

With Embodiment 2, since the metallic elements M used for all the metal target was Ti, and the gases fed into the vacuum chamber were Ar, and methane ($CH_4$) gas only, respective compositions of all the hard coatings formed on the surface of the substrate were as represented by $Ti_xC_b$. In Table 2, only the atomic ratio of C is shown as b, and the constituent other than C was only Ti.

Test pieces Nos. 13, 27, 28, shown in Table 2, each show the results of checking by analysis of the composition of a hard coating formed on the surface of a substrate, obtained by keeping an arc current, and a methane $CH_4$ partial pressure in the same condition, respectively, and variously changing the application evaporation source. The atomic ratio of C in a hard coating formed by use of the application evaporation source A was 0.7, the atomic ratio of C in a hard coating formed by use of the application evaporation source B was 0.8, and the atomic ratio of C in a hard coating formed by use of the application evaporation source C was 0.45. Both the application evaporation sources A, B that were able to form a hard coating containing C at a high atomic ratio, respectively, were the arc evaporation sources for forming magnetic field lines that are substantially orthogonal to an evaporation face of the target, and are diverging forward, or traveling in parallel with each other.

In other words, it was verified that the atomic ratio of C in the hard coating could be suitably increased by forming the magnetic field lines substantially orthogonal to the evaporation face of the target, and diverging forward, or traveling in parallel with each other.

Figure 5:
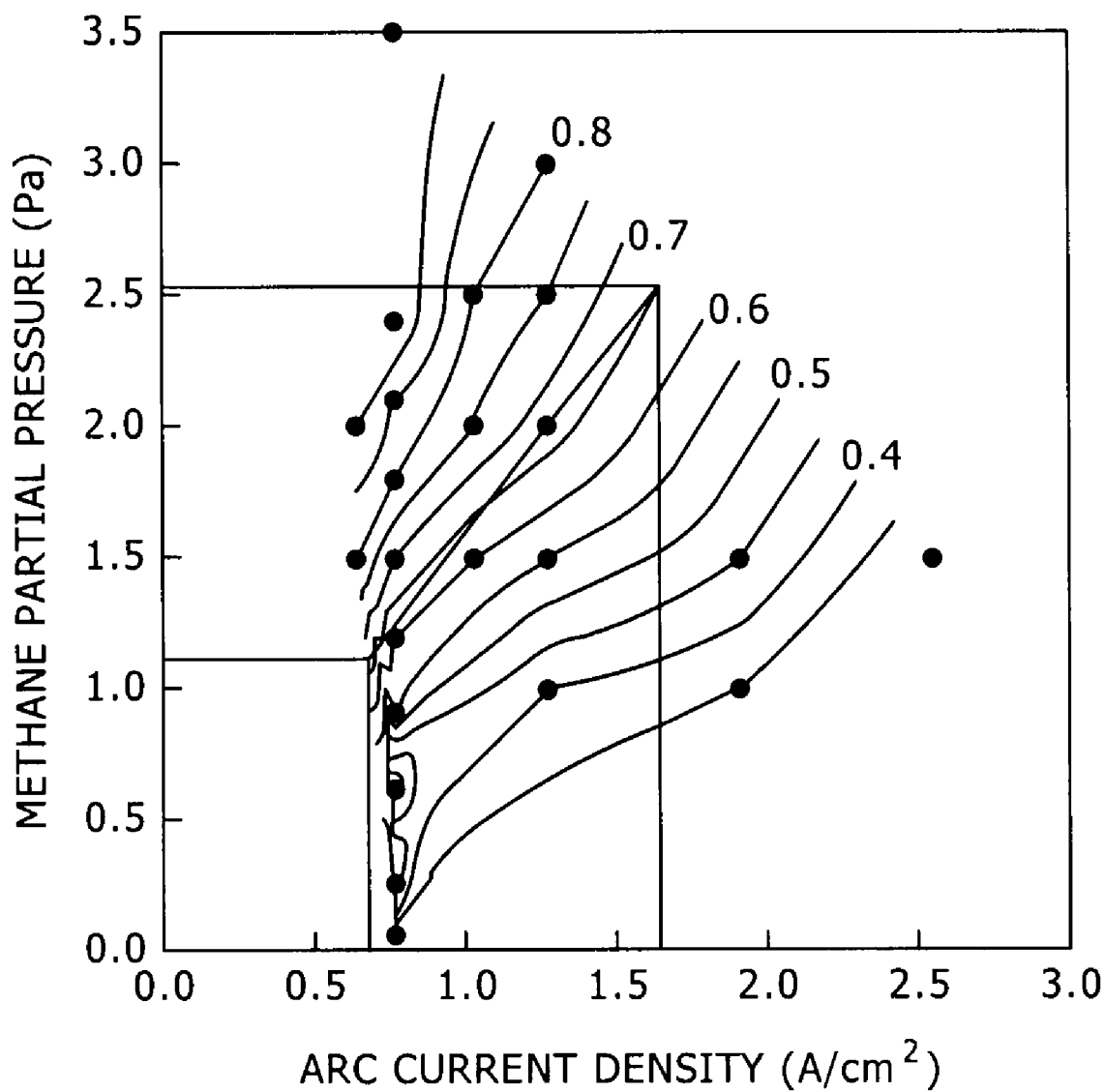
FIG. 5 is an illustrative view plotting a relationship between methane partial pressure, and arc current density in the case where a metallic element M is Ti, and a hydrocarbon gas is methane ($CH_4$) gas.

In FIG. 5, there was plotted a relationship between the methane partial pressure (Pa), and the arc current density ($A/cm^2$) with respect to each of test pieces on the basis of test results shown in Table 2. Further, the relationship between the methane partial pressure, and the arc current density by the atomic ratio of C in a hard coating was found by joining test

TABLE 2

| No. | Application evaporation source | Target | Arc current (A) | Current density ($A/cm^2$) | $CH_4$ ratio | $CH_4$ partial pressure | Total pressure | b |
|---|---|---|---|---|---|---|---|---|
| 1 | A | Ti | 20 | 0.25 | 50 | 1.5 | 3 | — |
| 2 | A | Ti | 50 | 0.64 | 50 | 1.5 | 3 | 0.80 |
| 3 | A | Ti | 50 | 0.64 | 50 | 2.0 | 4 | 0.90 |
| 4 | A | Ti | 60 | 0.76 | 50 | 1.5 | 3 | 0.70 |
| 5 | A | Ti | 60 | 0.76 | 20 | 0.6 | 3 | 0.30 |
| 6 | A | Ti | 60 | 0.76 | 30 | 0.9 | 3 | 0.55 |
| 7 | A | Ti | 60 | 0.76 | 40 | 1.2 | 3 | 0.60 |
| 8 | A | Ti | 60 | 0.76 | 60 | 1.8 | 3 | 0.80 |
| 9 | A | Ti | 60 | 0.76 | 70 | 2.1 | 3 | 0.85 |
| 10 | A | Ti | 60 | 0.76 | 80 | 2.4 | 3 | 0.95 |
| 11 | A | Ti | 60 | 0.76 | 50 | 0.05 | 0.1 | 0.30 |
| 12 | A | Ti | 60 | 0.76 | 50 | 0.25 | 0.5 | 0.55 |
| 13 | A | Ti | 60 | 0.76 | 50 | 1.5 | 3 | 0.70 |
| 14 | A | Ti | 60 | 0.76 | 50 | 3.5 | 7 | 0.95 |
| 15 | A | Ti | 80 | 1.02 | 50 | 1.5 | 3 | 0.60 |
| 16 | A | Ti | 80 | 1.02 | 50 | 2.5 | 5 | 0.80 |
| 17 | A | Ti | 80 | 1.02 | 50 | 2.0 | 4 | 0.75 |
| 18 | A | Ti | 100 | 1.27 | 50 | 1.5 | 3 | 0.55 |
| 19 | A | Ti | 100 | 1.27 | 50 | 1.5 | 3 | 0.55 |
| 20 | A | Ti | 100 | 1.27 | 50 | 2.0 | 4 | 0.675 |
| 21 | A | Ti | 100 | 1.27 | 100 | 3.0 | 3 | 0.80 |
| 22 | A | Ti | 100 | 1.27 | 50 | 2.5 | 5 | 0.75 |
| 23 | A | Ti | 100 | 1.27 | 50 | 1.0 | 2 | 0.40 |
| 24 | A | Ti | 150 | 1.91 | 50 | 1.5 | 3 | 0.45 |
| 25 | A | Ti | 150 | 1.91 | 50 | 1.0 | 2 | 0.35 |
| 26 | A | Ti | 200 | 2.55 | 50 | 1.5 | 3 | 0.30 |
| 27 | B | Ti | 60 | 0.76 | 50 | 1.5 | 3 | 0.80 |
| 28 | C | Ti | 60 | 0.76 | 50 | 1.5 | 3 | 0.45 | data points with each other, and generating intermediate points therebetween by interpolation, thereby drawing a contour plan of the atomic ratios of C to be shown in FIG. 5. Since the atomic ratio b of C is more preferably not less than 0.7 in the case where B and N are not added, as previously described, it is evident that a region above an oblique line shown in FIG. 5, expressed by the formula of the methane partial pressure (Pa)=0.163+1.44×the arc current density (A/cm$^2$), will suffice as a recommendable relationship between the methane partial pressure, and the arc current density.

Accordingly, if the metallic element M is Ti, a hydrocarbon gas is methane (CH$_4$) gas, and the relationship between the methane partial pressure, and the arc current density can satisfy the formula of the methane partial pressure (Pa) >0.163+1.44×the arc current density (A/cm$^2$), it is possible to render C content of the coating not less than a suitable atomic ratio 0.7 such that free C constituent not in reaction with Ti can be generated without fail.

With the embodiment 2, there is described the case where the metallic element M used for all the metal targets was Ti, however, the formula as above can be applied to the case of a metal target composed of V, and so forth, having an evaporation amount equivalent to that of Ti at an identical arc current. Further, the case of a metal target having a different evaporation amount can be coped with by addition of an appropriate corrective action.

Embodiment 3

A hard coating containing W was formed on the surface of a substrate in the arc ion plating system 1 of the cathode-discharge type, shown in FIG. 1, wherein W was used for the metallic element M, and a W$_{0.5}$C$_{0.5}$ target (a hot pressed product of ϕ100 mm) composed of WC was used as the target.

At the time of film formation for the hard coating containing W, there were adopted conditions that an arc current was set to 150 A, a methane (CH$_4$) flow ratio, and a nitrogen (N$_2$) flow ratio were varied in a range of 0 to 30 vol %, respectively, and further, Ar was fed into the vacuum chamber to thereby adjust a total pressure to be at 1.33 Pa. In the respective cases of test pieces 15 to 17, shown in Table 3, where B was added, a B$_2$H$_6$ gas was further fed into the vacuum chamber. A film formation temperature was set to 400° C., and a bias voltage was set to 100 V.

A film thickness of a hard coating containing W, in as-formed state, was 10 μm, and a crystal structure of the hard coating was identified by x-ray diffraction. The x-ray diffraction was carried out under conditions that Cuk α was used as an x-ray source, and measurement on a region in a range of 10 to 100° was carried out by the (θ–2θ) method under conditions of 40 kV-40 mA, whereupon a crystal phase was identified from peaks as observed.

Checking of respective compositions of the hard coatings containing W was carried out by analysis with the use of the electron beam micro-analyzer (EPDA). Further, a sliding property test was conducted under the same conditions as for embodiment 1. In the sliding property test, respective coatings were examined in respect of coefficient of friction, and a wear depth under conditions at 25° C. when no heating is applied (room temperature), and at 400° C., respectively. The coefficient of friction, small in value, indicates insusceptibility to seizure, and the wear depth, small in value, indicates excellent wear resistance. Further, as to the coefficient of friction, a mean value thereof for a slide distance in a range of 100 to 300 m where the most stable data are obtainable within a slide distance described hereunder was adopted as data. A pass/fail criterion for the coefficient of friction was not more than 0.35, and a pass/fail criterion for the wear depth was not more than 2.0 μm. The results of the test are shown in Table 3.

TABLE 3

| No. | Application evaporation source | Target | CH$_4$ flow ratio vol % | N$_2$ flow ratio vol % | W(x) | B(a) | C(b) | N(c) | x − a − c |
|---|---|---|---|---|---|---|---|---|---|
| | | | | | | Atomic ratio | | | |
| 1 | AIP | WC | 0 | 0 | 0.7 | 0 | 0.3 | 0 | 0.7 |
| 2 | AIP | WC | 10 | 0 | 0.4 | 0 | 0.6 | 0 | 0.4 |
| 3 | AIP | WC | 20 | 0 | 0.3 | 0 | 0.7 | 0 | 0.3 |
| 4 | AIP | WC | 30 | 0 | 0.2 | 0 | 0.8 | 0 | 0.2 |
| 5 | AIP | WC | 0 | 10 | 0.65 | 0 | 0.3 | 0.05 | 0.6 |
| 6 | AIP | WC | 0 | 40 | 0.5 | 0 | 0.35 | 0.15 | 0.35 |
| 7 | AIP | WC | 15 | 5 | 0.39 | 0 | 0.6 | 0.01 | 0.38 |
| 8 | AIP | WC | 17.5 | 7.5 | 0.3 | 0 | 0.65 | 0.05 | 0.25 |
| 9 | AIP | WC | 15 | 30 | 0.25 | 0 | 0.6 | 0.15 | 0.1 |
| 10 | AIP | WC | 5 | 10 | 0.45 | 0 | 0.5 | 0.05 | 0.4 |
| 11 | AIP | WC | 15 | 10 | 0.4 | 0 | 0.55 | 0.05 | 0.35 |
| 12 | ALP | WC | 15 | 20 | 0.35 | 0 | 0.55 | 0.10 | 0.25 |
| 13 | AIP | WC | 15 | 40 | 0.3 | 0 | 0.47 | 0.23 | 0.07 |
| 14 | AIP | WC | 20 | 10 | 0.2 | 0 | 0.75 | 0.05 | 0.15 |
| 15 | AIP | WC | 15 | 10 | 0.25 | 0.05 | 0.65 | 0.05 | 0.15 |
| 16 | AIP | WC | 15 | 10 | 0.25 | 0.12 | 0.58 | 0.05 | 0.08 |
| 17 | AIP | WC | 15 | 10 | 0.25 | 0.22 | 0.48 | 0.05 | −0.02 |
| 18 | AIP | WC | 50 | 0 | 0.1 | 0 | 0.9 | 0 | 0.1 |
| 19 | AIP | WC | 10 | 35 | 0.2 | 0 | 0.6 | 0.2 | 0 |
| 20 | AIP | WC | 5 | 25 | 0.5 | 0 | 0.4 | 0.1 | 0.4 |

| No. | Crystal structure Measurement by x-rays | Coefficient of friction, at 25° C. Mean value for 100-300 m | Coefficient of friction, at 400° C. Mean value for 100-300 m | Wear depth at 25° C. μm | Wear depth at 400° C. μm |
|---|---|---|---|---|---|
| 1 | W2C | 0.5 | 0.55 | 4.5 | 5.6 |
| 2 | WC1 − x | 0.3 | 0.3 | 1.7 | 2.3 |
| 3 | WC1 − x | 0.2 | 0.3 | 2.1 | 2.5 |

TABLE 3-continued

| | | | | |
|---|---|---|---|---|
| 4 | WC1 − x | 0.2 | 0.3 | 2.2 | 2.4 |
| 5 | W2C + δWN | 0.4 | 0.5 | 3.4 | 4.5 |
| 6 | W2C + δWN | 0.55 | 0.6 | 3.5 | 4.7 |
| 7 | WC1 − x + δWN | 0.27 | 0.3 | 1.2 | 1.8 |
| 8 | WC1 − x + δWN | 0.2 | 0.18 | 0.3 | 0.7 |
| 9 | WC1 − x + δWN | 0.3 | 0.35 | 0.8 | 1.5 |
| 10 | WC1 − x + δWN | 0.3 | 0.3 | 1.1 | 1.7 |
| 11 | WC1 − x + δWN | 0.2 | 0.22 | 0.4 | 0.6 |
| 12 | WC1 − x + δWN | 0.24 | 0.25 | 0.5 | 0.8 |
| 13 | δWN | 0.35 | 0.4 | 3 | 3.7 |
| 14 | WC1 − x + δWN | 0.18 | 0.2 | 0.2 | 0.4 |
| 15 | WC1 − x + δWN | 0.2 | 0.18 | 0.3 | 0.7 |
| 16 | WC1 − x + δWN | 0.2 | 0.17 | 1 | 1.1 |
| 17 | Amorphous state | 0.3 | 0.4 | 3.7 | 5 |
| 18 | Amorphous state | 0.1 | 0.3 | 4.5 | 6 |
| 19 | δWN | 0.3 | 0.35 | 3.2 | 4.1 |
| 20 | W2C + δWN | 0.4 | 0.35 | 4.6 | 5 |

Respective compositions (atomic ratios) of coatings in as-formed state are as shown in Table 3. It could be verified that test pieces Nos. 7 to 12, and 14 to 16, shown in Table 3, each were a coating of composition meeting a condition according to claim 3, and were a mixture film having the crystals of both WC 1-x, and δ-WN. Further, the coefficient of friction of all the coatings was found as small as not more than 0.35 either under the condition at 25° C. (room temperature), or under the condition at 400° C., and the wear depth thereof was as small as not more than 2.0 μm either under the condition at 25° C. (room temperature), or under the condition at 400° C. Accordingly, it was found out that those hard coatings containing W, having the composition meeting the condition according to claim 3, were excellent in wear resistance, insusceptible to seizure, and capable of maintaining excellent sliding property even after application over the long term.

Furthermore, with test pieces Nos. 8, 11, 12, 14, and 15, all thereof, corresponding to a range shown as a more preferable composition range as to B, C, N, as previously described, it was found out that the coefficient of friction of a coating was found not more than 0.25 either under the condition at 25° C. (room temperature), or under the condition at 400° C., and the wear depth thereof was not more than 1.0 μm either under the condition at 25° C. (room temperature), or under the condition at 400° C., thus proving that the coating is excellent in frictional properties, and wear resistance, in particular.

Further, it could be verified from the results of a test on test pieces Nos. 1, 5, and 6, respectively, that the atomic ratio b of C contained in the coating did not reach a range as set forth in claim 3 even with the use of the target composed of WC unless in an atmosphere that contains a C-containing gas ($CH_4$ gas).

Embodiment 4

A hard coating containing W was formed on the surface of a substrate by a sputtering method using W for the metallic element M, and using a $W_{0.5}C_{0.5}$ target (diameter: 10 inches) composed of WC as a target, as is the case with Embodiment 3, at a total pressure 0.6 Pa in an atmosphere of methane-nitrogen.

A deposition rate in the case of forming the hard coating containing W on the surface of a substrate by the sputtering method was compared with that in the case of forming the hard coating containing W on the surface of a substrate by the arc ion plating method according to Embodiment 3. The results of such comparison are shown in Table 4.

TABLE 4

| No. | Application evaporation source | Target | Arc condition Arc current, methane flow ratio, nitrogen flow ratio | Sputtering condition Power, methane flow ratio, nitrogen flow ratio | Deposition rate μm/hr |
|---|---|---|---|---|---|
| 1 | AIP | WC | 150 A, methane 10%, nitrogen 10% | | 5 |
| 2 | SPUTTERING | WC | | 2 kV, methane 10%, nitrogen 10% | 1 |

Table 4 shows that it was possible to implement film formation at a deposition rate of only 1 μm per hour by the sputtering method in contrast to film formation implemented at a deposition rate of 5 μm per hour by the arc ion plating method, thereby verifying that the arc ion plating method is capable of forming the hard coating containing W at a higher speed.

Embodiment 5

A hard coating containing W was formed on the surface of a substrate in the arc ion plating system 1 of the cathode-discharge type, shown in FIG. 1, using a $W_{0.5}C_{0.5}$ target (a hot pressed product of φ100 mm), as is the case with Embodiment 3.

The hard coating containing W was formed under conditions that an arc current was set to 150 A, methane ($CH_4$) flow ratio and nitrogen ($N_2$) flow ratio were set to 10 vol %, respectively, and further, Ar was fed into the vacuum chamber to thereby adjust a total pressure to be at 1.33 Pa. A film formation temperature was set to 400° C., and a bias voltage was varied in a range of −30 to −20 V, having thereby formed a coating (all atomic ratios are in accordance with $W_{0.38}C_{0.55}N_{0.07}$) 10 μm thick.

In order to check sliding property of the coating, a sliding property test was conducted under the same conditions as those for Embodiment 1, and Embodiment 3. In the sliding property test, respective coatings were examined in respect of coefficient of friction, and a wear depth under conditions at 25° C. when no heating is applied (room temperature), and at 400° C., respectively. The coefficient of friction, small in value, indicates insusceptibility to seizure, and the wear depth, small in value, indicates excellent wear resistance. Further, as to the coefficient of friction, a mean value thereof for a slide distance in a range of 100 to 300 m where the most stable data are obtainable within a slide distance described hereunder was adopted as data. The pass/fail criteria for the coefficient of friction, and the wear depth, respectively, were not more than 0.35, and not more than 2.0 μm, respectively, as is the case with other embodiments. With the present embodiment, however, it was determined that the coefficient of friction not more than 0.25, and the wear depth not more than 1.0 μm were more preferable. The results of the test are shown in Table 5.

was set to 1 Pa, and a nitrogen ($N_2$) partial pressure was set to 0.33 Pa, thereby setting the total pressure to 2.66 Pa while setting a film formation temperature to 400° C., and the bias voltage to −70 V.

In the case of using the WC target, it was possible to implement film formation on the surface of the substrate, however, in the case of using the W target, arc discharge could not be sustained, and therefore, it was not possible to implement the film formation on the surface of the substrate. That is, in the case of using the W target, the arc discharge was unstable, so that the hard coating containing W could not be stably formed, but with the use of the WC target, the hard coating containing W could be stably formed.

It should be understood by those skilled in the art that various modifications, combinations, sub-combinations and alterations may occur depending on design requirements and other factors insofar as they are within the scope of the appended claims or the equivalents thereof.

TABLE 5

| No. | Application evaporation source | Target | Bias voltage (−V) | Crystal structure Measurement by x-rays | Coefficient of friction, at 25° C. Mean value for 100-300 m | Coefficient of friction, at 400° C. Mean value for 100-300 m | Wear depth at 25° C. μm | Wear depth at 400° C. μm |
|---|---|---|---|---|---|---|---|---|
| 1 | AIP | WC | 30 | WC1 − x + δWN | 0.27 | 0.2 | 1.1 | 2 |
| 2 | AIP | WC | 50 | WC1 − x + δWN | 0.2 | 0.15 | 0.45 | 1 |
| 3 | AIP | WC | 70 | WC1 − x + δWN | 0.2 | 0.15 | 0.4 | 0.8 |
| 4 | AIP | WC | 100 | WC1 − x + δWN | 0.22 | 0.17 | 0.5 | 0.8 |
| 5 | AIP | WC | 150 | WC1 − x + δWN | 0.25 | 0.2 | 1 | 1.2 |
| 6 | AIP | WC | 200 | WC1 − x + δWN | 0.3 | 0.25 | 1.2 | 1.5 |

Table 5 shows that because respective compositions (atomic ratios) of coatings satisfy requirements as set forth in claim 3, all test pieces Nos. 1 to 6 meet the pass/fail criteria. With test pieces Nos. 2 to 4 among all the test pieces, coefficient of friction was found not more than 0.25 either under the condition at 25° C. (room temperature), or under the condition at 400° C., and wear depth was found not more than 1.0 μm either under the condition at 25° C. (room temperature), or under the condition at 400° C. It is evident from those results that if a bias voltage is kept in a range of −50 to −100 V, this will cause frictional properties and wear resistance to be further enhanced.

Embodiment 6

There was conducted a test for forming a hard coating containing W on the surface of a substrate in the arc ion plating system 1 of the cathode-discharge type, shown in FIG. 1, using a $W_{0.5}C_{0.5}$ target (a hot pressed product of φ100 mm), or a W target.

In the case of using the $W_{0.5}C_{0.5}$ target, the hard coating containing W was formed under conditions that an arc current was set to 150 A, a methane ($CH_4$) flow ratio, and a nitrogen ($N_2$) flow ratio were set to 10 vol %, respectively, and further, Ar was fed into the vacuum chamber to thereby adjust a total pressure to be at 1.33 Pa. A film formation temperature was set to 400° C., and a bias voltage was set to −70 V, having thereby formed a coating 10 μm thick (the same condition as that for test piece No. 3 of Embodiment 3).

Meanwhile, in the case of using the W target, a coating 10 μm thick was formed under conditions that an Ar partial pressure was set to 1.33 Pa, a methane ($CH_4$) partial pressure

What is claimed is:

1. A hard coating excellent in sliding property, as a hard coating expressed by a chemical formula $M_xB_aC_bN_c$, wherein M is W, the hard coating having chemical composition satisfying respective formulas expressed by:

$$0 \leq a \leq 0.12;$$

$$0.5 < b \leq 0.8;$$

$$0.01 \leq c < 0.15;$$

$$0 < x-a-c;$$

$$x-a-c<b \leq 0.9;$$

$$0.2 \leq x < 0.5; \text{ and}$$

$$x+a+b+c=1,$$

where x, a, b, and c denote respective atomic ratios of M, B, C, and N.

2. The hard coating excellent in sliding property according to claim 1, wherein the atomic ratio a is 0.

3. The hard coating excellent in sliding property according to claim 1, wherein a crystal structure includes a mixture of δ-WN and WC 1−x.

4. A method for forming the hard coating as set forth in claim 1 on the surface of a substrate, said method comprising the steps of:
    preparing a metal target composed of the metallic element M, or a complex target composed of the metallic element M, and B;
    making use of the metal target, or the complex target, in an atmosphere of a mixture of Ar and a hydrocarbon gas, or mixture of Ar, the hydrocarbon gas, and nitrogen gas, within a cathode arc ion plating system; and forming magnetic field lines substantially orthogonal to an evaporation face of the target, and diverging forward, or traveling in parallel with each other, thereby forming the hard coating on the surface of the substrate.

5. The method for forming the hard coating according to claim 4, wherein the metallic element M is Ti, or V, and the hydrocarbon gas is methane ($CH_4$) gas, a relationship between a methane partial pressure (Pa), and an arc current density ($A/cm^2$) satisfying a formula expressed by methane partial pressure (Pa)>0.163+1.44×arc current density ($A/cm^2$).

6. A method for forming the hard coating as set forth in claim 1 on the surface of a substrate, said method comprising the steps of:

preparing a target composed of WC;

making use of the target in an atmosphere of a mixture containing a carbon-containing gas and nitrogen within a cathode arc ion plating system; and forming magnetic field lines substantially orthogonal to an evaporation face of the target, and diverging forward, or traveling in parallel with each other, thereby forming the hard coating on the surface of the substrate.

7. The hard coating according to claim 1, wherein b is from 0.5 to 0.75.

8. The hard coating according to claim 1, wherein c is from 0.08 to 0.15.

9. The hard coating according to claim 1, wherein x is from 0.2 to 0.45.

10. The hard coating according to claim 1, wherein x−a−c is from 0.08 to 0.38.

11. The hard coating according to claim 1, having a coefficient of friction at 25° C. of from 0.18 to 0.27.

12. The hard coating according to claim 1, having a coefficient of friction at 400° C. of from 0.17 to 0.35.

13. The hard coating according to claim 1, having a wear depth at 25° C. of from 0.2 to 1.1 μm.

14. The hard coating according to claim 1, having a wear depth at 400° C. of from 0.4 to 1.8 μm.

15. The hard coating according to claim 1, wherein $0.55<b\leqq0.8$.

* * * * *